(12) United States Patent
Nakayama

(10) Patent No.: US 7,087,989 B2
(45) Date of Patent: Aug. 8, 2006

(54) SEMICONDUCTOR DEVICE, ELECTRONIC DEVICE, ELECTRONIC APPARATUS, AND METHOD OF MANUFACTURING SEMICONDUCTOR DEVICE

(75) Inventor: Toshinori Nakayama, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/852,860

(22) Filed: May 25, 2004

(65) Prior Publication Data

US 2005/0006784 A1 Jan. 13, 2005

(30) Foreign Application Priority Data

May 30, 2003 (JP) .............................. 2003-155889

(51) Int. Cl.
*H01L 23/02* (2006.01)
(52) U.S. Cl. ...................................... 257/686; 438/108
(58) Field of Classification Search ............... 257/686, 257/723, 730, 778, 678, 685, 777; 438/108, 438/109
See application file for complete search history.

(56) References Cited

U.S. PATENT DOCUMENTS

| 5,973,392 | A | 10/1999 | Senba et al. | ................ | 257/686 |
| 6,468,831 | B1 * | 10/2002 | Leong et al. | ................ | 438/108 |
| 6,583,503 | B1 * | 6/2003 | Akram et al. | ................ | 257/686 |
| 6,607,937 | B1 * | 8/2003 | Corisis | ...................... | 438/108 |
| 6,906,415 | B1 * | 6/2005 | Jiang et al. | ................. | 257/723 |

FOREIGN PATENT DOCUMENTS

JP    10-284683    10/1998

* cited by examiner

Primary Examiner—David Nelms
Assistant Examiner—Quoc Hoang
(74) Attorney, Agent, or Firm—Hogan & Hartson, LLP

(57) ABSTRACT

A semiconductor device includes a first semiconductor package, in which a first semiconductor chip is mounted and a second semiconductor package, in which a second semiconductor chip is mounted and which is supported above the first semiconductor package so as to extend off the first semiconductor package.

12 Claims, 7 Drawing Sheets

SEMICONDUCTOR DEVICE, ELECTRONIC DEVICE, ELECTRONIC APPARATUS, AND METHOD OF MANUFACTURING SEMICONDUCTOR DEVICE

BACKGROUND OF THE INVENTION

1. Field of the Invention

The present invention relates to a semiconductor device, an electronic device, an electronic apparatus, a method of manufacturing a semiconductor device, and particularly to those suitable for being applied to a stacked structure of semiconductor packages or the like.

2. Description of Related Art

In a conventional semiconductor device, in order to save space when mounting semiconductor chips, there has been a method of stacking semiconductor chips, which are mounted on the same sized carrier substrates.

However, in the method of stacking semiconductor chips mounted on the same sized carrier substrates, a problem exists in that the number of stacked carrier substrates increases and the total thickness of the stacked structure increases as the number of chips increases. Thus, the present invention is intended to provide a semiconductor device, an electronic device, an electronic apparatus, and a method of manufacturing the semiconductor device, which can realize a stacked structure of semiconductor packages while suppressing an increase in the thickness of the stacked structure.

SUMMARY OF THE INVENTION

In order to solve the above described problem, a semiconductor device according to an embodiment of the present invention includes a first semiconductor package, in which a first semiconductor chip is mounted, and a second semiconductor package, in which a second chip is mounted and which is supported above the first semiconductor package so as to extend off the first semiconductor package.

Accordingly, the second semiconductor package, which is larger in size than the first semiconductor package, can be stacked above the first semiconductor package. For this reason, while suppressing an increase in the mounting region of the first semiconductor package, the number of chips mounted above the first semiconductor package can be increased, and a space-savings can be attained when mounting the semiconductor chips.

Furthermore, in a semiconductor device according to an embodiment of the present invention, a plurality of the second semiconductor chips are mounted in the second semiconductor package. Accordingly, a plurality of the second semiconductor chips can be aligned for arrangement above the first semiconductor package without increasing the size of the first semiconductor package. For this reason, even when mounting a plurality of semiconductor chips, an increase in the mounting region of the first semiconductor package can be suppressed while suppressing an increase in the height, and a space-savings can be attained when mounting the semiconductor chips.

Furthermore, a semiconductor device according to an embodiment of the present invention includes a first semiconductor package, in which a first semiconductor chip is mounted, and a second semiconductor package, in which a second semiconductor chip is mounted and which is supported above the first semiconductor package so as to extend off the first semiconductor package. A third semiconductor package, in which a third semiconductor chip is mounted and which is supported above the first semiconductor package so as to extend off the first semiconductor package is also provided.

Accordingly, a plurality of the second semiconductor packages, which are larger in size than the first semiconductor package, can be stacked above the first semiconductor package. For this reason, even when the chip sizes or types are different, the number of chips mounted above the first semiconductor package can be increased while suppressing an increase in the height, and while enabling to realize various kinds of functions, the space-savings can be attained when mounting the semiconductor chips.

Furthermore, a semiconductor device according to an embodiment of the present invention includes a first semiconductor chip, and a first semiconductor package, in which a second semiconductor chip is mounted and which is mounted above the first semiconductor chip. Accordingly, the semiconductor package, which is larger in size than the first semiconductor chip, can be directly stacked above the first semiconductor chip. For this reason, while suppressing an increase in the height, a plurality of the second semiconductor chips can be stacked above the first semiconductor chip and an increase in the mounting region when mounting the first semiconductor chip can be suppressed and a space-savings can be attained when mounting a plurality of semiconductor chips.

Furthermore, a semiconductor device according to an embodiment of the present invention includes a first carrier substrate, above which a first semiconductor chip is mounted, a second semiconductor substrate, above which a second semiconductor chip is mounted, and a protruding electrode, which is bonded to the first carrier substrate and which holds the second carrier substrate above the first semiconductor chip so that the second carrier substrate extends off the first carrier substrate.

Accordingly, the second carrier substrate, which is larger in size than the first carrier substrate, can be stacked above the first carrier substrate so that the second carrier substrate is arranged above the first semiconductor chip. For this reason, while suppressing an increase in the mounting region of the first carrier substrate, the number of chips mounted above the first semiconductor chip can be increased and a space-savings can be attained when mounting the semiconductor chips.

Furthermore, a semiconductor device according to an embodiment of the present invention includes a first carrier substrate, above which a first semiconductor chip is mounted, a second carrier substrate, above which a second semiconductor chip is mounted, a third carrier substrate, above which a third semiconductor chip is mounted and a first protruding electrode, which is bonded to the first carrier substrate and which holds the second carrier substrate above the first semiconductor chip so that the second carrier substrate extends off the first carrier substrate. A second protruding electrode is provided, which is bonded to the first carrier substrate and which holds the third carrier substrate above the first semiconductor chip so that the third carrier substrate extends off the first carrier substrate.

Accordingly, a plurality of carrier substrates, which are larger in size than the first carrier substrate, can be stacked above the first semiconductor chip so that a plurality of the carrier substrates are arranged above the first semiconductor chip. For this reason, even when the chip sizes or types are different, the number of chips arranged above the first semiconductor chip can be increased while suppressing an increase in the height, and while enabling to realize various kinds of functions. Also, a space-savings can be attained when mounting the semiconductor chips.

Furthermore, a semiconductor device according to an embodiment of the present invention includes a first carrier substrate, above which a first semiconductor chip is mounted, a second semiconductor chip, in which a re-routing wiring layer is formed via a stress relieving layer, and a protruding electrode, which is coupled to the re-routing wiring layer and which holds the second semiconductor chip above the first carrier substrate so that the second semiconductor chip extends off the first carrier substrate.

Accordingly, the number of chips, which can be mounted above the first carrier substrate, can be increased while suppressing an increase in the size of the first carrier substrate. As such, it is unnecessary to interpose a carrier substrate between the first semiconductor chip and the second semiconductor chip even when the second semiconductor chip is arranged above the first semiconductor chip. For this reason, even when a plurality of semiconductor chips are mounted, an increase in the mounting region of the first carrier substrate can be suppressed while suppressing an increase in the height, and a space-savings can be attained when mounting the semiconductor chips.

Furthermore, a semiconductor device according to an embodiment of the present invention includes a first carrier substrate, above which a first semiconductor chip is mounted, and a second semiconductor chip, which is mounted on the first carrier substrate so as to extend off the first carrier substrate. Accordingly, the number of chips, which can be mounted above the first carrier substrate, can be increased without stacking the second semiconductor chips mutually. For this reason, even when the number of semiconductor chips to be mounted is increased, an increase in the mounting region of the first carrier substrate can be suppressed while suppressing an increase in the height, and space-savings can be attained when mounting the semiconductor chips.

Furthermore, a semiconductor device according to an embodiment of the present invention includes a first semiconductor chip, in which a through-hole electrode is formed, a first carrier substrate, above which a second semiconductor chip is mounted, and a coupling terminal, which couples the through-hole electrode to the first carrier substrate so as to arrange the first carrier substrate above the first semiconductor chip. Accordingly, the first carrier substrate, which is larger in size than the first semiconductor chip, can be directly stacked above the first semiconductor chip. For this reason, a plurality of the second semiconductor chips can be stacked above the first semiconductor chip while suppressing an increase in the height, an increase in the mounting region when mounting the first semiconductor chip can be suppressed, and a space-savings can be attained when mounting a plurality of semiconductor chips.

Furthermore, an electronic device according to an embodiment of the present invention includes a first package, in which a first electronic component is mounted, and a second package, in which a second electronic component is mounted and which is supported above the first package so as to extend off the first package. Accordingly, the second package, which is larger in size than the first package, can be stacked above the first package. For this reason, the number of components, which are mounted on the first package, can be increased while suppressing an increase in the mounting region of the first package, and the space-saving can be attained when mounting electronic components.

Furthermore, an electronic apparatus according to an embodiment of the present invention includes a first semiconductor package, in which a first semiconductor chip is mounted, a second semiconductor package, in which a second semiconductor chip is mounted and which is supported above the first semiconductor package so as to extend off the first semiconductor package, a mother substrate, above which the first semiconductor package is mounted, and an electronic component, which is coupled to the first semiconductor chip and the second semiconductor chip via the mother substrate.

Accordingly, a three-dimensional mounting structure of a semiconductor package can be realized while enabling to suppress an increase in the height, and the weight savings and the miniaturization of an electronic apparatus can be attained, while enabling to improve the functionality of the electronic apparatus. Furthermore, a method of manufacturing semiconductor device according to an embodiment of the present invention includes mounting a first semiconductor chip above a first carrier substrate, mounting a second semiconductor chip above a second carrier substrate, forming a protruding electrode on the second carrier substrate and bonding the protruding electrode on the first carrier substrate so that the second carrier substrate extends off the first carrier substrate.

Accordingly, even when the second carrier substrate is larger in size than the first carrier substrate, the second carrier substrate can be stacked above the first carrier substrate, above which the first semiconductor chip is mounted, by bonding the protruding electrode to the first carrier substrate, and an increase in the height of the stacked structure of the semiconductor packages can be suppressed while suppressing complications in the manufacturing process.

DESCRIPTION OF THE PREFERRED EMBODIMENTS

Figure 1:
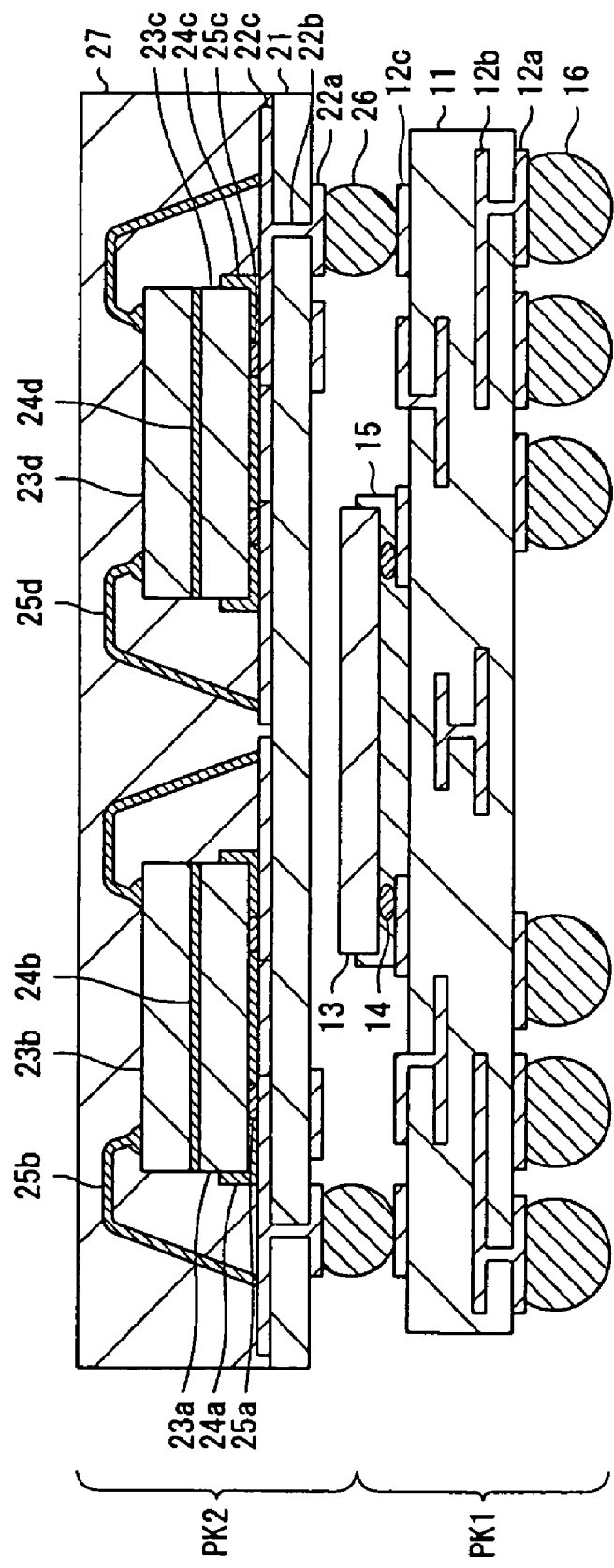
FIG. 1 is a sectional view showing a schematic structure of a semiconductor device according to a first embodiment of the present invention.

Hereinafter, semiconductor devices according to embodiments of the present invention will be described by referring to the drawings. FIG. 1 is a sectional view showing a schematic structure of a semiconductor device according to a first embodiment of the present invention.

In FIG. 1, a semiconductor package PK1 has a carrier substrate 11 provided therein, lands 12a and 12c are formed on both sides of the carrier substrate 11, and internal wiring 12b is formed inside the carrier substrate 11. Then, a semiconductor chip 13 is flip-chip mounted above the carrier substrate 11, and a protruding electrode 14 for flip-chip mounting is formed on the semiconductor chip 13. Then, the protruding electrode 14, formed on the semiconductor chip 13, is bonded to the land 12c by Anisotropic Conductive Film (ACF) bonding via an anisotropic conductive film 15. Moreover, on the land 12a formed on the back surface of the carrier substrate 11, a protruding electrode 16 for mounting the carrier substrate 11 above a motherboard is formed.

On the other hand, the semiconductor package PK2 has a carrier substrate 21 provided therein, lands 22a and 22c are formed on both sides of the carrier substrate 21, and an internal wiring 22b is formed inside the carrier substrate 21. Then, a plurality of the semiconductor chips 23a and 23c are flip-chip mounted above the carrier substrate 21, and protruding electrodes 25a and 25c for flip-chip mounting are formed on the semiconductor chips 23a and 23c respectively. Then, the protruding electrodes 25a and 25c, formed on the semiconductor chips 23a and 23c respectively, are bonded to the land 22c by ACF bonding via anisotropic conductive films 24a and 24c respectively. Furthermore, above the semiconductor chips 23a and 23c, the semiconductor chips 23b and 23d are face-up mounted respectively, and the semiconductor chips 23b and 23d are fixed above the semiconductor chips 23a and 23c via adhesion layers 24b and 24d respectively, while being wire-bonded to the land 22c via conductive wirings 25b and 25d respectively. In addition, the semiconductor package PK2 may be of a stacked structure using only the wire bonding, as well as a stacked structure using both of the flip-chip and wire bonding.

Moreover, a sealing resin 27 is provided over the entire surface of the carrier substrate 21, which is the mounting side of the semiconductor chips 23a through 23d, and thus the semiconductor chips 23a through 23d are sealed by the sealing resin 27. In addition, when sealing the semiconductor chips 23a through 23d by the sealing resin 27, a molding using a thermosetting resin such as an epoxy resin can be conducted, for example.

Furthermore, on the land 22a formed on the back surface of the carrier substrate 21, a protruding electrode 26 for mounting the carrier substrate 21 above the carrier substrate 11 is formed so that the carrier substrate 21 is held above the semiconductor chip 13. The protruding electrode 26 is arranged, while avoiding the mounting region of the semiconductor chip 13, for example, the protruding electrode 26 can be arranged on the periphery of the back surface of the carrier substrate 21. And, by bonding the protruding electrode 26 to the land 12c formed on the carrier substrate 11, the carrier substrate 21 is mounted above the carrier substrate 11 so as to arrange the carrier substrate 21 above the semiconductor chip 13.

The size of the carrier substrate 21 can be made larger than that of the carrier substrate 11. And, when the carrier substrate 21 is mounted above the carrier substrate 11, the carrier substrate 21 can be arranged above the carrier substrate 11 so that at least one end of the carrier substrate 21 extends off laterally. Accordingly, the semiconductor package PK2 or the like having a larger size than the semiconductor package PK1 can be stacked above the semiconductor package PK1. Even when the semiconductor chips 23a through 23d are mounted above the semiconductor package PK1, it is unnecessary to stack the semiconductor chips 23c and 23d above the semiconductor chips 23a and 23b. For this reason, while suppressing an increase in the mounting region of the semiconductor package PK1, an increase in the height of the semiconductor package PK2 can be suppressed, and a space-savings can be attained when mounting the semiconductor chips 13 and 23a through 23d.

In addition, when the carrier substrate 21 is mounted above the carrier substrate 11, the back surface of the carrier substrate 21 may make contact with the semiconductor chip 13, or the back surface of the carrier substrate 21 may be apart from the semiconductor chip 13. Moreover, as for the protruding electrodes 16 and 26, a solder ball can be used, for example. For this reason, the packages PK1 and PK2, having different sizes, can be stacked mutually by using a general ball grid array (BGA) method, thereby the production lines can be commonly used.

In addition, as for the carrier substrates 11 and 21, for example, a double-sided substrate, a multilayer-interconnection substrate, a build-up substrate, a tape substrate, or a film substrate or the like can be used, and as for the material of the carrier substrates 11 and 21, for example, a polyimide resin, a glass epoxy resin, a BT resin, a composite of aramid and epoxy, a ceramic or the like can be used. Moreover, as for the protruding electrodes 14, 16 and 26, for example, an Au bump, a Cu bump or a Ni bump covered with a solder material or the like, as well as a solder ball can be used. As for the conductive wirings 25b and 25d, for example, an Au wire, an Al wire or the like can be used. Moreover, in order to mount the carrier substrate 21 above the carrier substrate 11, a method of forming the protruding electrode 26 on the land 22a of the carrier substrate 21 has been described, however, the protruding electrode 26 may be formed on the land 12c of the carrier substrate 11.

Moreover, in the above described embodiment, a method of mounting the semiconductor chip 13 above the carrier substrate 11 by ACF bonding has been described, however, other weld bonding such as Nonconductive Film (NCF) bonding, Anisotropic Conductive Paste (ACP) bonding and Nonconductive Paste (NCP) bonding may be used, for example, and metal bonding such as solder bonding and alloy bonding may be used. Furthermore, in the above described embodiment, a method of mounting only one semiconductor chip 13 above the carrier substrate 11 has been described as an example. However, a plurality of semiconductor chips may be mounted above the carrier substrate 11. In addition, resin may be filled into the gap between the carrier substrate 11 and the carrier substrate 21, as required.

Moreover, in the above described embodiment, a stacked structure, in which the semiconductor package PK2 extends off both sides of the semiconductor package PK1 has been described, however, the semiconductor package PK2 may extend off one side of the semiconductor package PK1. Moreover, the semiconductor package PK2 may extend off two directions of the right/left and the front/rear of the semiconductor package PK1, or the semiconductor package PK2 may extend off only one direction of the right/left or the front/rear of the semiconductor package PK1.

Figure 2:
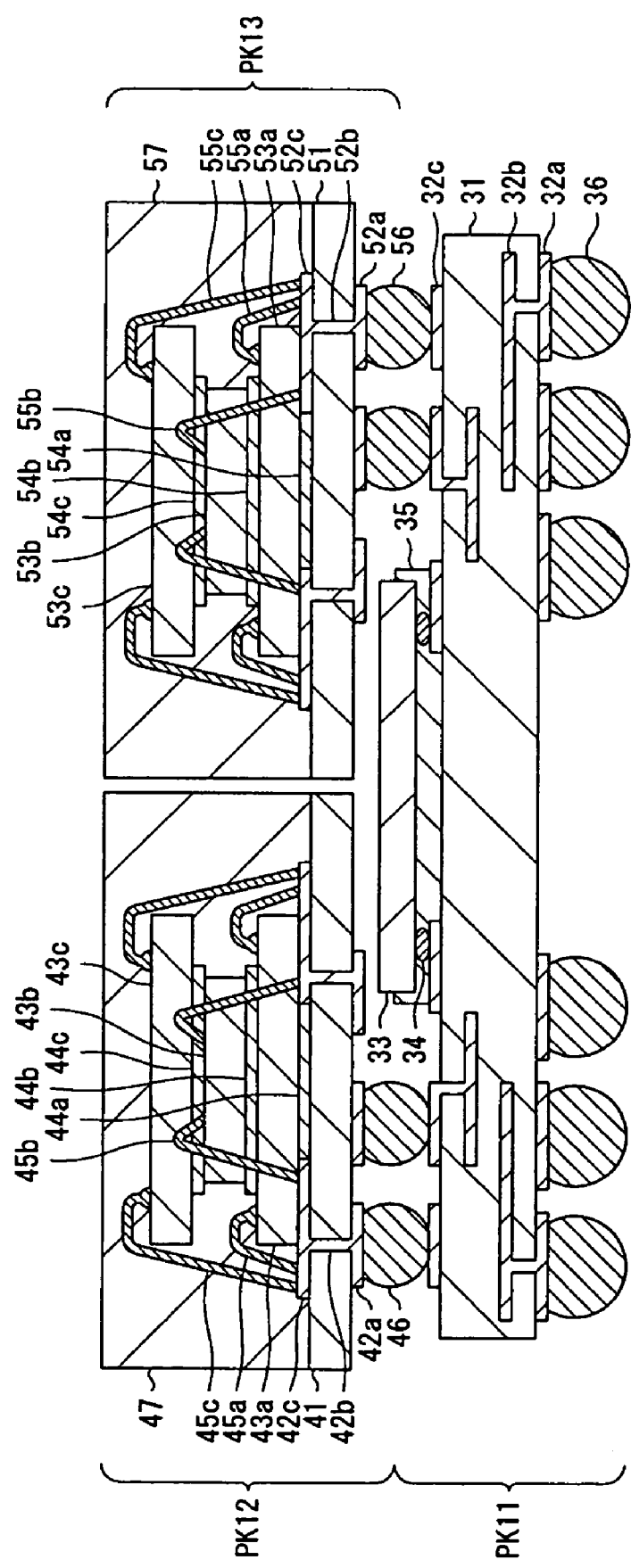
FIG. 2 is a plan view showing a method of arranging protruding electrodes according to a second embodiment of the present invention.

Moreover, in the above described embodiment, as for the semiconductor package PK1, a flip-chip mounted structure has been described as an example. However, a molded structure may be used. Moreover, the semiconductor package PK2 may be of a single layer structure of a semiconductor chip as well as a stacked structure of semiconductor chips, and may be of a flip-chip structure as well as a molded structure. FIG. 2 is a sectional view showing a schematic structure of a semiconductor device according to a second embodiment of the present invention.

In FIG. 2, a semiconductor package PK11 has a carrier substrate 31 provided therein, lands 32a and 32c are formed on both sides of the carrier substrate 31, and an internal wiring 32b is formed in the carrier substrate 31. Then, a semiconductor chip 33 is flip-chip mounted on the carrier substrate 31, and a protruding electrode 34 for flip-chip mounting is formed on the semiconductor chip 33. Then, the protruding electrode 34, formed on the semiconductor chip 33, is bonded to the land 32c by ACF bonding via an anisotropic conductive film 35. Moreover, on the land 32a formed on the back surface of the carrier substrate 31, a protruding electrode 36 for mounting the carrier substrate 31 above a mother substrate is formed.

On the other hand, the semiconductor packages PK12 and PK13 have carrier substrates 41 and 51 provided therein, respectively. Then, lands 42a and 52a are formed respectively on the back surfaces of the carrier substrates 41 and 51, lands 42c and 52c are formed respectively on the front surfaces of the carrier substrates 41 and 51, and internal wirings 42b and 52b are formed respectively in the carrier substrates 41 and 51.

Then, above the carrier substrates 41 and 51, semiconductor chips 43a and 53a are face-up mounted via adhesion layers 44a and 54a, respectively, and the semiconductor chips 43a and 53a are wire-bonded to lands 42c and 52c via conductive wirings 45a and 55a, respectively. Furthermore, above the semiconductor chips 43a and 53a, semiconductor chips 43b and 53b are face-up mounted, respectively, while avoiding the conductive wirings 45a and 55a, and the semiconductor chips 43b and 53b are fixed above the semiconductor chips 43a and 53a via adhesion layers 44b and 54b, respectively, while being wire-bonded to the lands 42c and 52c via conductive wirings 45b and 55b, respectively. Furthermore, above the semiconductor chips 43b and 53b, semiconductor chips 43c and 53c are face-up mounted, respectively, while avoiding the conductive wirings 45b and 55b, and the semiconductor chips 43c and 53c are fixed above the semiconductor chips 43b and 53b via adhesion layers 44c and 54c, respectively, while being wire-bonded to the lands 42c and 52c via conductive wirings 45c and 55c respectively.

Moreover, sealing resin 47 and 57 are respectively provided over the entire surfaces of the carrier substrates 41 and 51, which are the mounting sides of the semiconductor chips 43a through 43c and 53a through 53c, and the semiconductor chips 43a through 43c and 53a through 53c are sealed by the sealing resin 47 and 57, respectively. In addition, when sealing the semiconductor chips 43a through 43c and 53a through 53c by the sealing resin 47 and 57, respectively, a molding using a thermosetting resin such as an epoxy resin can be conducted.

Moreover, on the lands 42a and 52a, formed on the back surfaces of the carrier substrates 41 and 51, respectively, protruding electrodes 46 and 56 for mounting the respective carrier substrates 41 and 51 above the carrier substrate 31 are formed so that the carrier substrates 41 and 51 are held above the semiconductor chip 33. By bonding the protruding electrodes 46 and 56 to the land 32c formed on the carrier substrate 31, the carrier substrates 41 and 51 can be mounted above the carrier substrate 31 so that the ends of the carrier substrates 41 and 51 are arranged above the semiconductor chip 33.

When mounting the carrier substrates 41 and 51 above the carrier substrate 31, the carrier substrates 41 and 51 can be arranged above the carrier substrate 31 so that at least one end of the carrier substrates 41 and 51 extend off laterally. Accordingly, a plurality of the semiconductor packages PK12 and PK13 can be aligned for arrangement above the semiconductor package PK11 without increasing the size of the semiconductor package PK11. For this reason, even when the chip sizes and types are different, the number of chips, which are mounted above the semiconductor package PK11, can be increased while suppressing an increase in the height, and while enabling to realize various functions. A space-savings can be attained when mounting the semiconductor chips 33, 43a through 43c and 53a through 53c.

In addition, in the above described embodiment, a method of mounting the two semiconductor packages PK12 and PK13 above the semiconductor package PK11 has been described. However, three or more semiconductor packages may be mounted above the semiconductor package PK11. Moreover, a plurality of semiconductor packages, which are different in size or type, may be mounted above the semiconductor package PK11.

Figure 3:
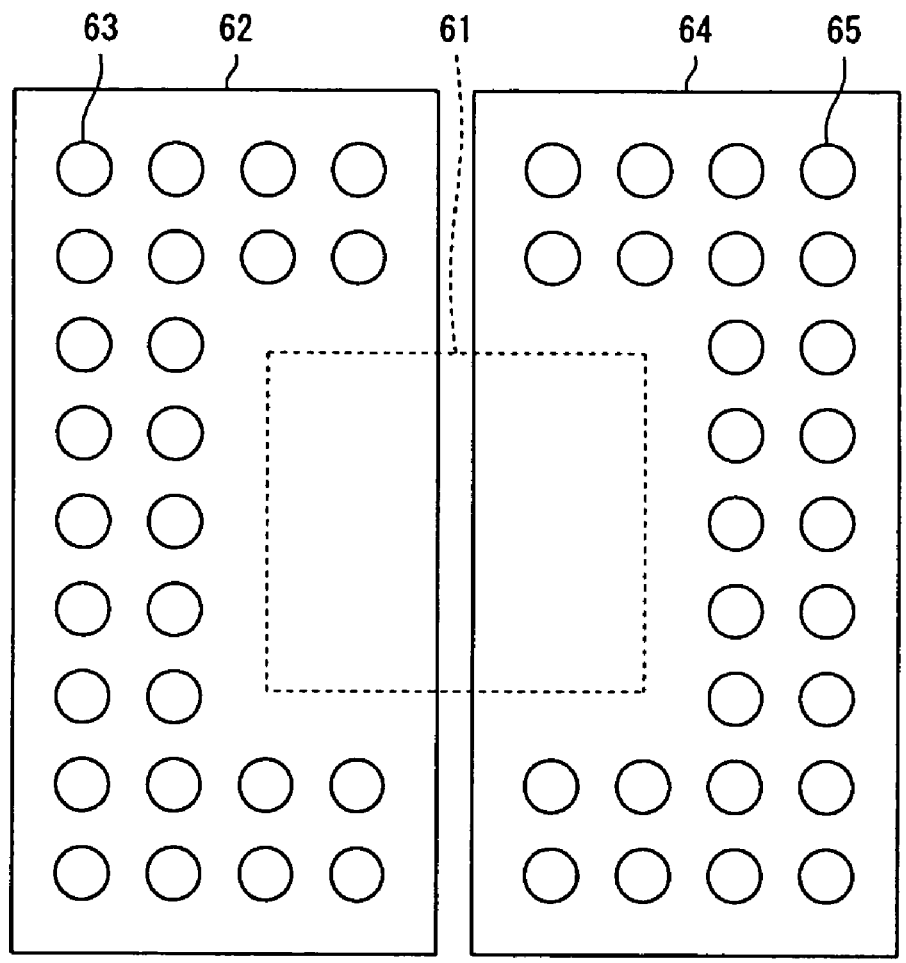
FIG. 3 is a sectional view showing a schematic structure of a semiconductor device according to a third embodiment of the present invention.

FIG. 3 is a plan view showing a method of arranging protruding electrodes according to a third embodiment of the present invention. In FIG. 3, on carrier substrates 62 and 64, protruding electrodes 63 and 65 are arranged in a U-shape, respectively, and regions, where the protruding electrodes 63 and 65 are not arranged, are provided along at least one side of the carrier substrates 62 and 64.

Then, the protruding electrodes 63 and 65, formed on the carrier substrates 62 and 64 respectively, are bonded to a lower substrate, above which the semiconductor chip 61 is provided, so that the regions, where the protruding electrodes 63 and 65 are not formed, overlap above the semiconductor chip 61. Accordingly, even when the carrier substrates 62 and 64 are mounted so that the ends of the carrier substrates 62 and 64 are arranged above the semiconductor chip 61, the stability of the carrier substrates 62 and 64 can be maintained, and while suppressing complication of the manufacturing process, a space-savings can be attained when mounting the semiconductor chips.

Figure 4:
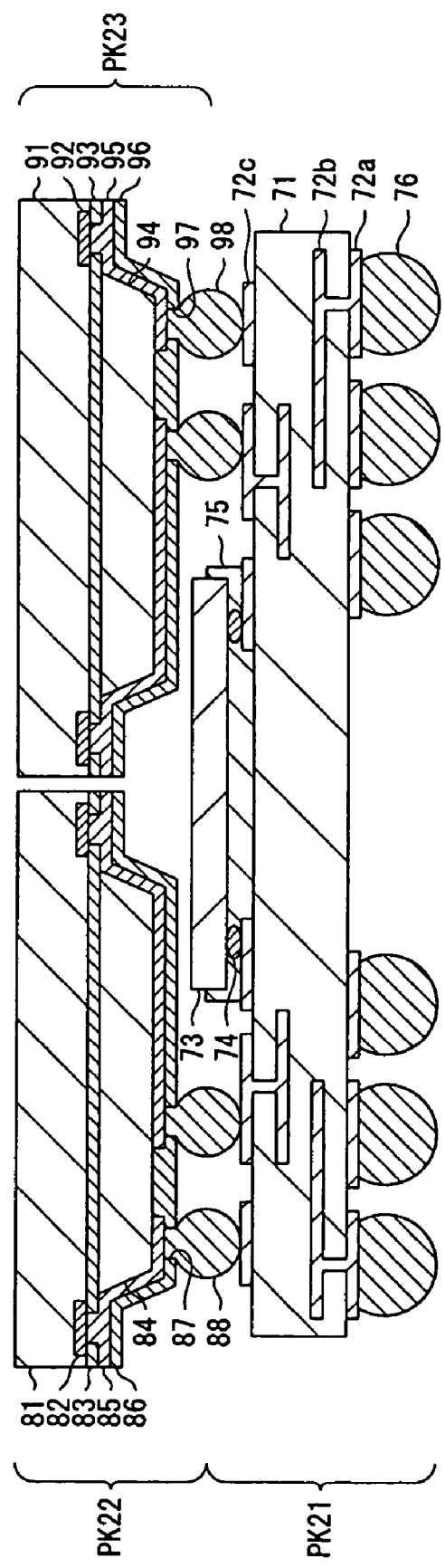
FIG. 4 is a sectional view showing a schematic structure of a semiconductor device according to a fourth embodiment of the present invention.

FIG. 4 is a sectional view showing a schematic structure of a semiconductor device according to a fourth embodiment of the present invention. In FIG. 4, a semiconductor package PK21 has a carrier substrate 71 provided therein. Lands 72a and 72c are formed on both sides of the carrier substrate 71, and an internal wiring 72b is formed in the carrier substrate 71. Then, a semiconductor chip 73 is flip-chip mounted above the carrier substrate 71, and a protruding electrode 74 for flip-chip mounting is formed on the semiconductor chip 73. Then, the protruding electrode 74, formed on the semiconductor chip 73, is bonded to the land 72c by ACF bonding via an anisotropic conductive film 75. Moreover, on the land 72a formed on the back surface of the carrier substrate 71, a protruding electrode 76 for mounting the carrier substrate 71 above a mother substrate is formed.

On the other hand, semiconductor packages PK22 and PK23 have semiconductor chips 81 and 91 provided therein, respectively, and on each of the semiconductor chips 81 and 91, electrode pads 82 and 92 are formed, respectively, and insulating layers 83 and 93 are formed, respectively, so that each of the electrode pads 82 and 92 is exposed. Then, on each of the semiconductor chips 81 and 91, stress relieving layers 84 and 95 are formed, respectively, so as to expose each of the electrode pads 82 and 92. On each of the electrode pad 82 and 92, re-routing wirings 85 and 95, which are extended on the stress relieving layers 84 and 94, respectively, are formed, respectively. Then, on each of the re-routing wirings 85 and 95, solder-resist layers 86 and 96 are formed, respectively, and on each of the solder-resist layers 86 and 96, opening portions 87 and 97, which expose the re-routing wirings 85 and 95 on each of the stress relieving layers 84 and 95, respectively, are formed. Then, on the re-routing wirings 85 and 95, exposed through each of the opening portions 87 and 97, respectively, protruding electrodes 88 and 98 for face-down mounting the respective semiconductor chips 81 and 91 above the carrier substrate 71 are formed so as to hold the ends of the semiconductor chips 81 and 91 above the semiconductor chip 73.

The protruding electrodes 88 and 98 can be arranged, while avoiding the mounting region of the semiconductor chip 73. For example, the protruding electrodes 88 and 98 can be arranged in a U-shape. Then, by bonding the protruding electrodes 88 and 98 on the land 72c, formed on the carrier substrate 71, and arranging the ends of the semiconductor chips 81 and 91 above the semiconductor chip 73, the semiconductor packages PK22 and PK23 are mounted above the semiconductor package PK21.

When the semiconductor chips 81 and 91 are mounted above the carrier substrate 71, the semiconductor chips 81 and 91 can be arranged above the carrier substrate 71 so that at least one end of each of the semiconductor chips 81 and 91 extends off laterally. Accordingly, a plurality of Wafer level—chip size package (W-CPS)s can be aligned for arrangement above the carrier substrate 71, above which the semiconductor chip 73 is flip-chip mounted, and the number of chips, which can be mounted above the carrier substrate 71, can be increased, while suppressing an increase in the size of the carrier substrate 71. Even when the semiconductor chips 81 and 91 are arranged above the semiconductor chip 73, it is unnecessary to interpose a carrier substrate between the semiconductor chip 73 and the semiconductor chips 81 and 91. For this reason, even when a plurality of the semiconductor chips 73, 81 and 91 are mounted above the carrier substrate 71, an increase in the mounting region of the carrier substrate 71 can be suppressed while suppressing an increase in the height, and a space-savings can be attained when mounting the semiconductor chips 73, 81 and 91.

Moreover, as for the protruding electrodes 74, 88 and 98, for example, an Au bump, a Cu bump or a Ni bump covered with a solder material or the like, as well as a solder ball can be used. In addition, in the above described embodiment, a method of mounting two semiconductor chips 81 and 91 above the semiconductor package PK21 has been described. However, three or more semiconductor chips may be mounted above the semiconductor package PK21. Moreover, a plurality of semiconductor packages, which are different in function or size, may be mounted above the semiconductor package PK21.

Moreover, in the above described embodiment, the semiconductor packages PK22 and PK23 using wafer level chip size packages have been described as an example. However, the semiconductor package may use, for example, other chip size packages such as a Tape level—chip size package (T-CSP), or a BGA in addition to the wafer level-chip size package.

Figure 5:
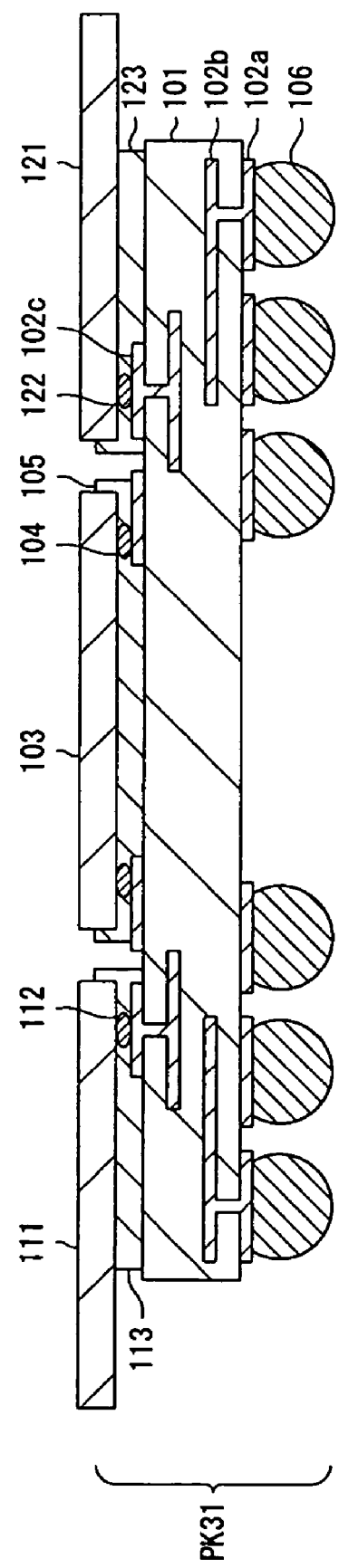
FIG. 5 is a sectional view showing a schematic structure of a semiconductor device according to a fifth embodiment of the present invention.

FIG. 5 is a sectional view showing a schematic structure of a semiconductor device according to a fifth embodiment of the present invention. In FIG. 5, a semiconductor package PK31 has a carrier substrate 101 provided therein. Lands 102a and 102c are formed on both sides of the carrier substrate 101, and an internal wiring 102b is formed in the carrier substrate 101. Then, a semiconductor chip 103 is flip-chip mounted above the carrier substrate 101, and a protruding electrode 104 for flip-chip mounting is formed on the semiconductor chip 103. Then, the protruding electrode 104, formed on the semiconductor chip 103, is bonded to the land 102c by ACF bonding via an anisotropic conductive film 105. Moreover, on the land 102a formed on the back surface of the carrier substrate 101, a protruding electrode 106 for mounting the carrier substrate 101 above a mother substrate is formed.

On the other hand, on the semiconductor chips 111 and 121, protruding electrodes 112 and 122 for flip-chip mounting the respective semiconductor chips 111 and 121 are formed. The protruding electrodes 112 and 122 can be arranged so as to locationally deviate to one side of the semiconductor chips 111 and 121. For example, the protruding electrodes 112 and 122 can be arranged in an L-shape or a U-shape. Then, the protruding electrodes 112 and 122, formed on the respective semiconductor chips 111 and 121, can be bonded to the land 102c by ACF bonding via anisotropic conductive films 113 and 123 respectively.

When the semiconductor chips 111 and 121 are mounted above the carrier substrate 101, the semiconductor chips 111 and 121 can be arranged above the carrier substrate 101 so that at least one end of each of the semiconductor chips 111 and 121 extends off laterally. Accordingly, a plurality of the semiconductor chips 111 and 121 can be aligned for arrangement above the carrier substrate 101, above which the semiconductor chip 103 is flip-chip mounted, and the number of chips, which can be mounted above the carrier substrate 101, can be increased, while suppressing an increase in the size of the carrier substrate 101. Even when the semiconductor chips 111 and 121 are arranged above the carrier substrate 101, it is unnecessary to interpose a carrier substrate between the semiconductor chip 103 and semiconductor chips 111 and 121. For this reason, even when a plurality of the semiconductor chips 103, 111 and 121 are mounted above the carrier substrate 101, an increase in the mounting region of the carrier substrate 101 can be suppressed while suppressing an increase in the height, and a space-savings can be attained when mounting the semiconductor chips 103, 111 and 121.

Moreover, as for the protruding electrodes 104, 112 and 122, for example, an Au bump, a Cu bump or a Ni bump covered with a solder material or the like, as well as a solder ball can be used. In addition, in the above described embodiment, a method of mounting three semiconductor chips 103, 111 and 121 above the carrier substrate 101 has been described. However, three or more semiconductor chips may be mounted above the carrier substrate 101. Moreover, a plurality of semiconductor packages, which are different in function or size, may be mounted above the carrier substrate 101.

Moreover, in the above described embodiment, a method of mounting the semiconductor chips 103, 111 and 121 above the carrier substrate 101 by ACF bonding has been described. However, other weld bondings such as NCF bonding, ACP bonding and NCP bonding may be used, for example, and metal bondings such as solder bonding and alloy bonding may be used. A semiconductor chip may be face-up mounted above the carrier substrate 101 so that the semiconductor chip extends off the carrier substrate 101, and the semiconductor chip, which is face-up mounted, may be wire-bonded.

Figure 6:
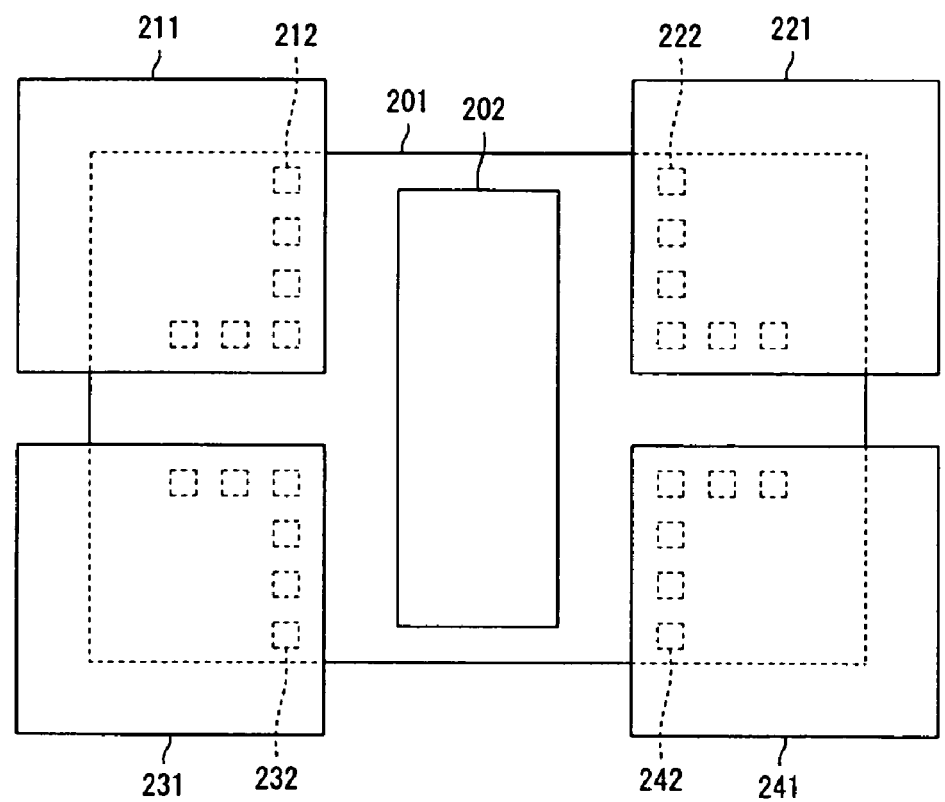
FIG. 6 is a plan view showing a method of arranging protruding electrodes according to a sixth embodiment of the present invention.

FIG. 6 is a plan view showing a method of arranging protruding electrodes according to a sixth embodiment of the present invention. In FIG. 6, on semiconductor chips 211, 221, 231 and 241, protruding electrodes 212, 222, 232 and 242 are respectively arranged in an L-shape, and the protruding electrodes 212, 222, 232 and 242 are arranged so as to locationally deviate on one end of each of the semiconductor chips 211, 221, 231 and 241, respectively. In addition, above a carrier substrate 201, a semiconductor chip 202 is face-down mounted.

Then, by bonding the protruding electrodes 212, 222, 232 and 242, formed on the respective semiconductor chips 211, 221, 231 and 241, to the carrier substrate 201, the respective semiconductor chips 211, 221, 231 and 241 are mounted above the carrier substrate 201 so that the respective semiconductor chips 211, 221, 231 and 241 extend off the carrier substrate 201.

Accordingly, even when the respective semiconductor chips 211, 221, 231 and 241 are mounted above the carrier substrate 201 so that the respective semiconductor chips 211, 221, 231 and 241 extend off the carrier substrate 201, the stability of the respective semiconductor chips 211, 221, 231 and 241 can be maintained, and while suppressing complications in the manufacturing process, a space-savings can be attained when mounting the semiconductor chips 201, 211, 221, 231 and 241.

Figure 7:
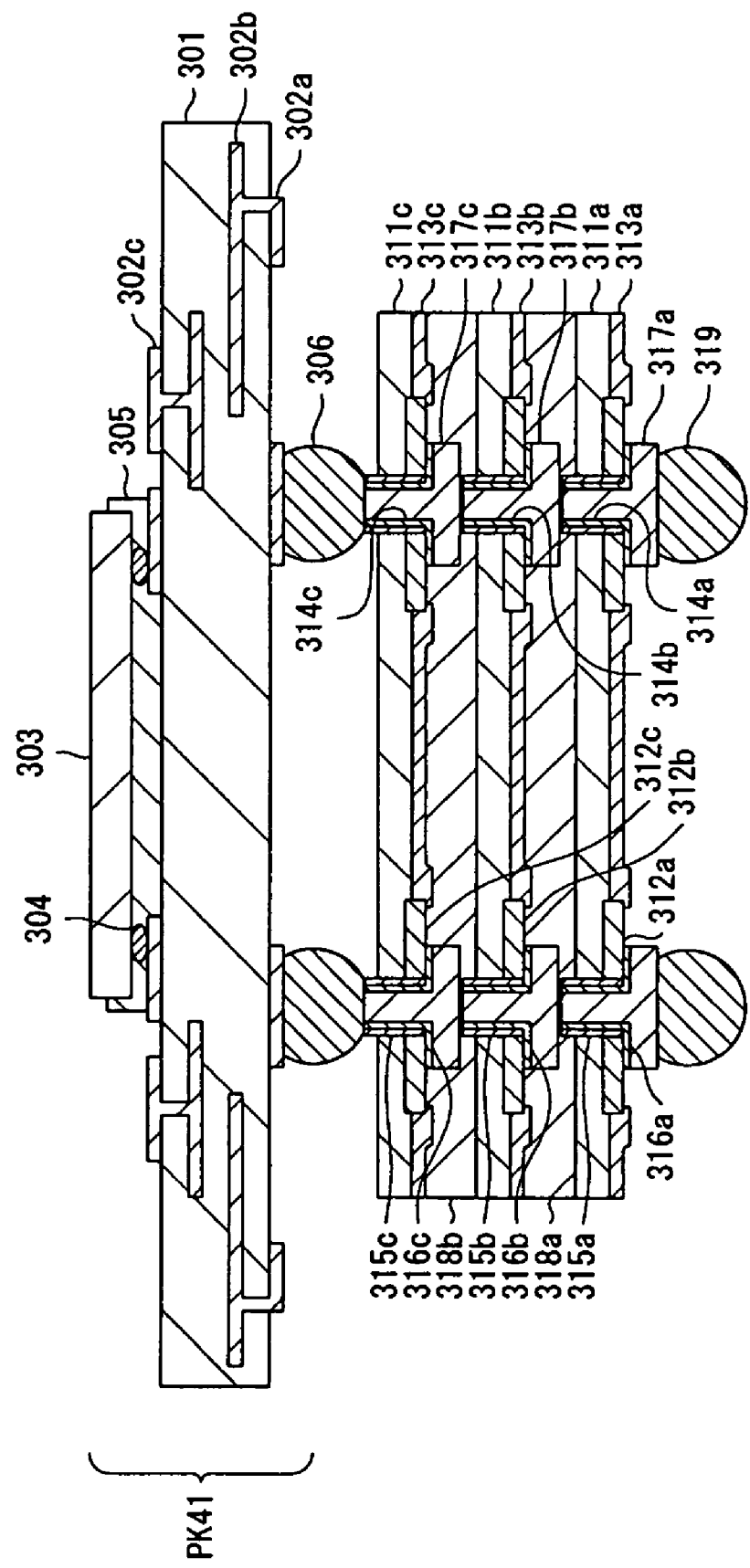
FIG. 7 is a sectional view showing a schematic structure of a semiconductor device according to a seventh embodiment of the present invention.

FIG. 7 is a sectional view showing a schematic structure of a semiconductor device according to a seventh embodiment of the present invention. In FIG. 7, a semiconductor package PK41 has a carrier substrate 301 provided therein. Lands 302a and 302c are formed on both sides of the carrier substrate 301, and an internal wiring 302b is formed in the carrier substrate 301. Then, a semiconductor chip 303 is flip-chip mounted above the carrier substrate 301, and a protruding electrode 304 for flip-chip mounting is formed on the semiconductor chip 303. Then, the protruding electrode 304, formed on the semiconductor chip 303, is bonded to the land 302c by ACF bonding via an anisotropic conductive film 305. Moreover, on the land 302a formed on the back surface of the carrier substrate 301, a protruding electrode 306 for mounting the carrier substrate 301 above a mother substrate is formed.

On the other hand, on semiconductor chips 311a through 311c, electrode pads 312a through 312c are formed, respectively, and insulating layers 313a through 313c are formed, respectively, so that each of the electrode pads 312a through 312c are exposed. Then, in the semiconductor chips 311a through 311c, for example, through-hole portions 314a through 314c are formed corresponding to the respective positions of the electrode pads 312a through 312c. Inside the through-hole portions 314a through 314c, through-hole electrodes 317a through 317c are formed, respectively, via respective insulating layers 315a through 315c and respective conductive films 316a through 316c. Then, the semiconductor chips 311a through 311c, in which the through-hole electrodes 317a through 317c are formed, respectively, are stacked via the through-hole electrodes 317a through 317c.

Moreover, on the through-hole electrode 317a formed in the semiconductor chip 311a, a protruding electrode 319 for mounting the stacked structure of the semiconductor chips 311a through 311c above a motherboard is formed. Then, the protruding electrode 306 is bonded to the through-hole electrode 317c, formed in the semiconductor chip 311c, so that the carrier substrate 301 is held above the semiconductor chip 311c.

When mounting the carrier substrate 301 above the semiconductor chip 311c, the carrier substrate 301 can be arranged above the semiconductor chip 311c so that at least one end of the carrier substrate 301 extends off laterally. Accordingly, the carrier substrate 301, whose size is larger than those of the semiconductor chips 311a through 311c, can be directly stacked above the semiconductor chip 311c. For this reason, the semiconductor chip 303, which is different in size or type, can be stacked above the semiconductor chips 311a through 311c while suppressing an increase in the height, an increase in the mounting region when mounting the semiconductor chips 311a through 311c can be suppressed, and the space-saving can be attained when mounting a plurality of the semiconductor chips 301 and 311a through 311c, which are different in size or type.

Moreover, when mounting the carrier substrate 301 above the semiconductor chip 311c, weld bondings such as ACF bonding, NCF bonding, ACP bonding and NCP bonding may be used, for example, and metal bondings such as solder bonding and alloy bonding may be used. Moreover, as for the protruding electrodes 304, 306 and 319, for example, an Au bump, a Cu bump or a Ni bump covered with a solder material or the like, as well as a solder ball may be used. Moreover, in the above described embodiment, a method of mounting the carrier substrate 301 above a three-layer structure of the semiconductor chips 311a through 311c has been described, however, a stacked structure of the semiconductor chips, above which the carrier substrate 301 is mounted, may be of one layer, two layers, or four layers or more.

Moreover, in the above described embodiments, methods of mounting semiconductor chips or semiconductor packages have been described as examples. However, the present invention is not necessarily limited to the methods of mounting semiconductor chips or semiconductor packages, but a ceramic element such as a surface acoustic wave (SAW) element, an optical element such as a light modulator and an optical switch, and various sensors such as a magnetic sensor and a bio-sensor may be mounted, for example.

In addition, the semiconductor devices and the electronic devices described above are applicable to an electronic apparatus such as a liquid crystal display device, a cellular phone, a Personal Digital Assistant, a video camera, a digital camera, and a Mini Disc (MD) player, and thus enable to attain the weight savings and miniaturization of an electronic apparatus, while enabling to improve the functionality of the electronic apparatus.

What is claimed is:

1. A semiconductor device, comprising:
   a first semiconductor package, in which a first semiconductor chip is mounted to an upper surface of a first carrier substrate; and
   a second semiconductor package, in which a second semiconductor chip is mounted to an upper surface of a second carrier substrate and which is supported above the first semiconductor package so as to extend off the first semiconductor package and define a gap between the first semiconductor package and the second semiconductor package,
   wherein protruding electrodes directly connect the second carrier substrate to the first carrier substrate,
   wherein the first carrier substrate directly supports the second carrier substrate via the protruding electrodes, and
   wherein the second semiconductor package includes a third semiconductor chip mounted on top of the second semiconductor chip via an adhesion layer formed between the second and third semiconductor chips.

2. The semiconductor device according to claim 1, wherein the second semiconductor package has a plural number of second semiconductor chips mounted thereon.

3. The semiconductor device according to claim 1, wherein the second semiconductor package includes a fourth semiconductor chip mounted to the upper surface of the second carrier substrate adjacent to the second semiconductor chip.

4. The semiconductor device according to claim 3, wherein the second semiconductor package includes a fifth semiconductor chip mounted on top of the fourth semiconductor chip via an adhesion layer formed between the fourth and fifth semiconductor chips.

5. The semiconductor device according to claim 4, wherein conductive wiring connects an upper surface of the third and fifth semiconductor chips to the second carrier substrate.

6. A semiconductor device, comprising:
- a first carrier substrate, above which a first semiconductor chip is mounted;
- a second carrier substrate, above which a second semiconductor chip is mounted; and
- a protruding electrode, which is bonded to the first carrier substrate and which holds the second carrier substrate above the first semiconductor chip so that the second carrier substrate extends off the first carrier substrate,
- wherein the protruding electrode directly connects the second carrier substrate to the first carrier substrate,
- wherein the first carrier substrate directly supports the second carrier substrate via the protruding electrodes, and
- wherein the second semiconductor package includes a third semiconductor chip mounted on top of the second semiconductor chip via an adhesion layer formed between the second and third semiconductor chips.

7. The semiconductor device according to claim 6, further comprising lands provided on both sides -of the first and second carrier substrates.

8. The semiconductor device according to claim 6, further comprising internal wirings formed inside the first and second carrier substrates.

9. The semiconductor device according to claim 6, wherein the first semiconductor chip is flip-chip mounted to the first carrier substrate.

10. The semiconductor device according to claim 6, wherein the second semiconductor chip is flip-chip mounted to the second carrier substrate.

11. An electronic device, comprising:
- a first package, in which a first electronic component is mounted;
- a second package, in which a second electronic component is mounted and which is supported above the first package so as to extend off the first package, and
- a plurality of protruding electrodes that directly connect the second package to the first package,
- wherein the first package directly supports the second package via the protruding electrodes, and
- wherein the second package includes a third electronic component mounted on top of the second electronic component via an adhesion layer formed between the second and third electronic components.

12. An electronic apparatus, comprising:
- a first semiconductor package, in which a first semiconductor chip is mounted;
- a second semiconductor package, in which a second semiconductor chip is mounted and which is supported above the first semiconductor package so as to extend off the first semiconductor package;
- a plurality of protruding electrodes that directly connect the second semiconductor package to the first semiconductor package, wherein the first semiconductor package directly supports the second semiconductor package via the protruding electrodes, and wherein the second semiconductor package includes a third semiconductor chip mounted on top of the second semiconductor chip via an adhesion layer formed between the second and third semiconductor chips;
- a mother substrate, above which the first semiconductor package is mounted; and
- an electronic component, which is coupled to the first semiconductor chip and the second semiconductor chip via the mother substrate.

* * * * *